(12) United States Patent  
Maguire

(10) Patent No.: US 9,274,147 B2  
(45) Date of Patent: Mar. 1, 2016

(54) AC PLUG RECEPTACLE WITH NON-CONTACT POWER METER AND RADIO TELEMETRY

(75) Inventor: Yael Maguire, Somerville, MA (US)

(73) Assignee: PLUM LABS, LLC, Somerville, MA (US)

( * ) Notice: Subject to any disclaimer, the term of this patent is extended or adjusted under 35 U.S.C. 154(b) by 622 days.

(21) Appl. No.: 13/402,730

(22) Filed: Feb. 22, 2012

(65) Prior Publication Data

US 2012/0215470 A1    Aug. 23, 2012

Related U.S. Application Data

(60) Provisional application No. 61/445,336, filed on Feb. 22, 2011.

(51) Int. Cl.
*G01R 15/18* (2006.01)
*G01R 21/133* (2006.01)

(52) U.S. Cl.
CPC ............. *G01R 15/18* (2013.01); *G01R 21/133* (2013.01)

(58) Field of Classification Search
CPC ........... G06F 1/26; G06F 1/266; G06Q 50/06; G01R 15/18; G01R 19/15; G01R 21/06; H02J 5/005; H02J 7/025; H02J 7/045; H02J 7/0047; H02J 9/061; H02J 13/0075; H02J 17/00; H01F 38/14; H01H 2300/03; H01R 13/6633
USPC ........... 702/62, 57, 60–61, 64–67, 70–71, 75, 702/81, 84, 127, 182–183, 188–189; 323/234, 241, 318, 355, 358, 364, 367, 323/369–370; 324/76.11, 126, 658, 691; 307/11, 29, 31, 112–113, 125, 307/130–131, 139–140; 361/600–601, 622, 361/641, 659–661; 700/286, 291–292, 295, 700/297–298; 715/412
See application file for complete search history.

(56) References Cited

U.S. PATENT DOCUMENTS

2011/0109301 A1* 5/2011 Johnson et al. ............... 324/119

OTHER PUBLICATIONS

Paprotny et al., Self-Powered MEMS Sensor Module for Measuring Electrical Quantities in Residential, Commercial, Distribution and Transmission Power Systems, 2010 IEEE, pp. 4159-4164.*
Takahashi et al., Real-Time Current-Waveform Sensor with Plugless Energy Harvesting from AC Power Lines for Home/Building Energy-Management Systems, Feb. 22, 2011, 2011 IEEE International Solid-State Circuits Conference Digest of Technical Papers (ISSCC), 3 pp.*

* cited by examiner

*Primary Examiner* — Toan Le
(74) *Attorney, Agent, or Firm* — Onello & Mello, LLP

(57) ABSTRACT

A power measurement device in accordance with aspects of the invention comprises a power harvesting unit that extracts a fraction of current flowing through an electric power supply unit to an electronic appliance; a power determination circuit that generates power measurement data indicative of at least one of the extracted current or a power consumed by the electronic appliance determined based on the extracted current; and an output device that outputs the power measurement data. The power measurement device can be used with plugs or sockets as an external component or integrated therein as an internal component.

36 Claims, 14 Drawing Sheets

AC PLUG RECEPTACLE WITH NON-CONTACT POWER METER AND RADIO TELEMETRY

CROSS-REFERENCE TO RELATED APPLICATIONS

This application claims the benefit, under 35 U.S.C §119(e), of U.S. Provisional Patent Application No. 61/445,336, filed on Feb. 22, 2011, entitled AC PLUG RECEPTACLE WITH NON-CONTACT POWER METER AND RADIO TELEMETRY, the disclosure of which is incorporated herein in its entirety by reference.

FIELD OF INTEREST

The present inventive concepts relate to the field of power consumption measurement devices, and more particularly to power monitors used for measuring electrical energy consumption of a device connected to an electrical outlet or socket, e.g., in a home or office setting.

BACKGROUND

Power monitors are devices that measure and output the energy consumption of an apparatus that is powered from an electric outlet or socket (referred to herein as an "electric appliance" or simply an "appliance"). Power monitors can be used in a number of ways to measure the energy consumption of any number of electric appliances. They can be used, for example, to measure the power consumption of appliances such as computers, televisions, kitchen appliances, and so on.

As is shown in FIG. 9, a power monitor typically takes the form of an electrical device that plugs into an electrical socket or outlet, and can include a built-in electric outlet into which can be plugged the appliance. A power monitor typically includes a display unit to locally display parameters of interest to the user. The display unit integrated into the plug portion or tethered thereto, as is shown in FIG. 9. These parameters can include instantaneous power, total energy consumption, cost, and carbon dioxide ($CO_2$) emissions. The latter two parameters require a conversion factor from energy to cost per kiloWatt-hours and kilogram of $CO_2$ per kiloWatt-hours be input into the device. To select between these various types of information on a display unit, power monitors typically contain a simple user interface composed of buttons to select between modes and input information.

In principle, power monitors interrupt the conduction path between the device and electrical socket or outlet. Power monitors measure the AC voltage on the electrical socket and measure the current flowing into the device via the interrupted current path. The current may be measured using an accurate and precise power resistor in series with the device and electrical socket, by measuring the voltage across this resistor. An electrical circuit is designed to convert the AC voltage on the electrical socket and produce a DC voltage to provide power to the remaining electronics in the power monitor. The remaining electronics may include an analog-to-digital converter, a microprocessor, display unit, and buttons. The analog-to-digital converter converts the voltage across the resistor into a digital signal that is input into the microprocessor. The microprocessor stores this information and converts it with the measured AC voltage into power and displays it on the display unit. The microprocessor may further integrate this power to produce energy, and can optionally provide a conversion to cost and or consumption of $CO_2$.

It is typically challenging to measure the complete consumption with device-level granularity in a home or commercial building using one or more power monitors. Without wireless communications, a user will typically plug their power monitor into a number of devices or surge protectors or power strips in their home serially to obtain a comprehensive picture of power consumption. This choice is limited by the size of the power monitor or cost, they are typically larger than the vertical spacing of outlets. These are also the same issues with a number of power monitors including wireless communications.

SUMMARY

Provided is a universal power measurement device that can be used, for example, to determine the power consumption of electronic appliances, such as consumer electronic products. In some embodiments, the power measurement device may be integrated into a power cord or electrical socket with no additional complexity for users or producers of power cords or outlets. In other instances, it may be desirable for the power measurement device to be a small attachment that fits over the protruding blades or prongs of an AC plug. In both cases, it may be desirable to include wireless communications to provide power consumption and other metrics to a computer or mobile device, or optionally provided to a network. In accordance with aspects of the present invention, the power measurement device does not interrupt the conduction path between the device and electrical socket or outlet.

Embodiments are focused on an integrated device that couples magnetically to the conductors of an AC plug, either as an attachment at the prongs or blades of an AC plug, or integrated into the plug or outlet. The magnetic coupling extracts a small fraction of the power flowing through the conductors to power a small circuit that measures the power consumption of the device and transmits this information wirelessly. In some embodiments, a voltage cascade circuit can be used to multiply the incoming voltage to a level appropriate for the electronics of the power measurement device. In other embodiments, a resistive analog to digital converter (ADC) and controller are arranged to measure the power consumption of the electric appliance, while maintaining a constant supply voltage to the electronics of the power measurement device.

In accordance with one aspect of the present disclosure, provided is a power measurement device, comprising: a power harvesting unit configured to extract a fraction of current flowing through an electric power supply unit to an electronic appliance; a power determination circuit that generates power measurement data indicative of at least one of the extracted current or a power consumed by the electronic appliance determined based on the extracted current; and an output device that outputs the power measurement data.

In one or more embodiments, the power harvesting unit can be configured to extract 1% or less of the current flowing through the electric power supply unit.

In one or more embodiments, the power harvesting unit can be configured to extract about 1 part in 100,000 of the current flowing through the electric power supply unit.

In one or more embodiments, the power harvesting unit can be or include an induction unit configured to extract the current using induction.

In one or more embodiments, the power harvesting unit can include a contact unit configured to extract the current through a physical coupling to the electrical power supply unit.

In one or more embodiments, the electric power supply unit can be an electrical connector or plug, an outlet, or a switch, as examples.

In one or more embodiments, the power measurement device can be a small attachment that slides over exposed contacts of an electrical connector (as an electric power supply unit). In some forms, the attachment can have a thickness of about 2-4 mm in the region of the contacts.

In one or more embodiments, the power measurement device can be a small attachment that slides over exposed contact(s) of a light bulb (as an electric power supply unit).

In one or more embodiments, the power measurement device can be a small attachment that fits between a switch (as an electric power supply unit) and a switch cover plate.

In one or more embodiments, the power measurement device can be integral with a plug, power cord, switch, light socket, or the electronic apparatus.

In one or more embodiments, the output device can comprise a local display integral with the housing (e.g., E-Ink or efficient LED) as a mechanism for reporting power measurement data to the user locally.

In one or more embodiments, the output device can comprise a wireless transmission device that transmits a signal indicative of the power measurement data.

In one or more embodiments, the wireless transmission device can include a radio frequency (RF) device. And the power measurement device can include a backscatter RF interface.

In one or more embodiments, the wireless transmission device can include a mobile device interface can enable the power measurement to be received by a mobile device (e.g., smart phone, tablet, laptop, PDA, et cetera).

In one or more embodiments, the mobile device interface can enable the power measurement to be received by a mobile device (e.g., smart-phone, tablet, laptop, PDA, et cetera).

In one or more embodiments, the mobile device can include an application that enables output of the power consumption data, which can include at least one of text and graphics, or other forms of output, whether static or dynamic.

In one or more embodiments, one or more stationary devices could also be provided to aggregate power measurement data from one or more power measurement devices. In one or more embodiments, such devices could include an access point, wireless modem, repeater, and the like.

In one or more embodiments, aggregated data could be made available to a computer or computer system via a network. The network could include the World Wide Web, and access to such data could be made available via a Web site, as an example.

In accordance with another aspect of the present invention, provided is a power measurement system that monitors power consumption within a facility. The system comprises at least one computer configured to receive power measurement data and at least one power measurement device. Each power measurement device comprises: a power harvesting unit configured to extract a fraction of current flowing through an electric power supply unit; a power determination circuit configured to generate power measurement data indicative of at least one of the extracted current or a power consumed through the electric power supply unit; and an output device that outputs the power measurement data.

In one or more embodiments, the at least one computer can be configured to aggregate power measurement data from a plurality of power measurement devices received via a network.

In one or more embodiments, the at least one computer can include at least one mobile device configured to receive and output the power measurement data.

In one or more embodiments, the at least one computer can be accessible via a network, and can enable access to the power measurement data via the network. The network can be the World Wide Web, the Internet, a private network, a LAN, a WAN, a VPN, a satellite network, a cable network, a phone network, or the like.

In one or more embodiments, the output device can include a wireless transmitter configured to communicate with the at least one computer via a local wireless network within the facility, and the wireless network can include an access point, a wireless modem, or a repeater.

In one or more embodiments, the electric power supply unit can be one of an electrical plug, an outlet, or a switch.

In one or more embodiments, the power measurement device can be integral with a plug.

In one or more embodiments, the power measurement device can be integral with an outlet.

In one or more embodiments, the power measurement device can be integral with a switch.

In one or more embodiments, the power measurement device can be integral with a light socket.

In one or more embodiments, the power measurement device can be removably attachable to the electronic appliance.

In one or more embodiments, the power measurement device can be removably attachable to a plug.

In one or more embodiments, the power measurement device can be removably attachable to an outlet.

In one or more embodiments, the power measurement device can be removably attachable to a switch.

In one or more embodiments, the power measurement device can be removably attachable to a light socket.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DETAILED DESCRIPTION OF PREFERRED EMBODIMENTS

Figure 1A:
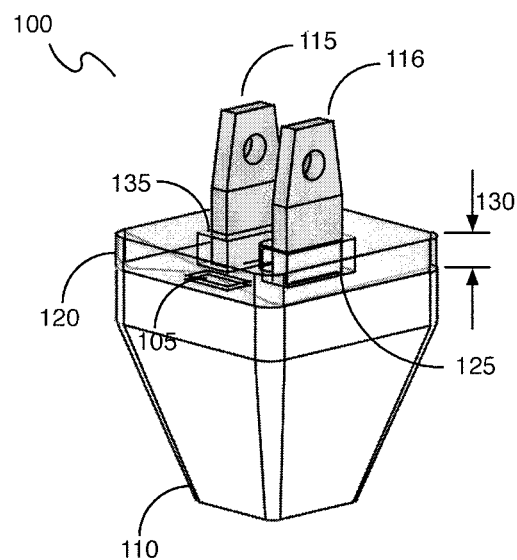
FIG. 1A is a perspective view of an embodiment of a power measurement device in accordance with the present invention, arranged on a standard electric plug.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present inventive concept.

Figure 1B:
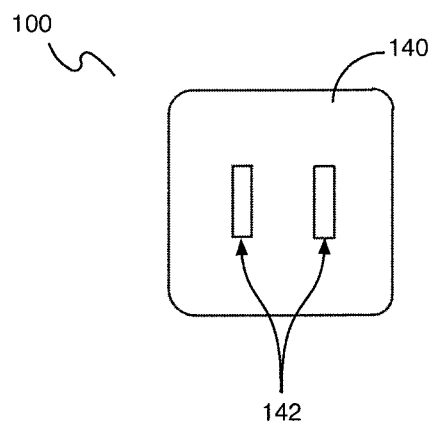
FIG. 1B is a front/rear view of the power measurement device of FIG. 1A, in accordance with aspects of the present invention.
Figure 1C:
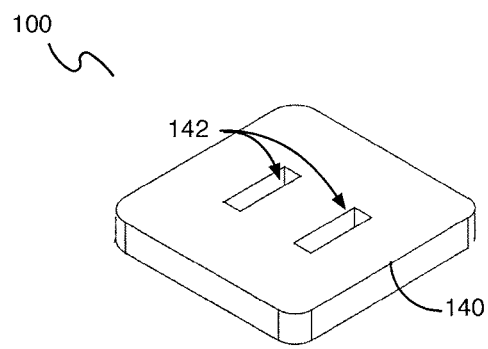
FIG. 1C is a perspective view of the power measurement device of FIG. 1A, in accordance with aspects of the present invention.
Figure 1D:
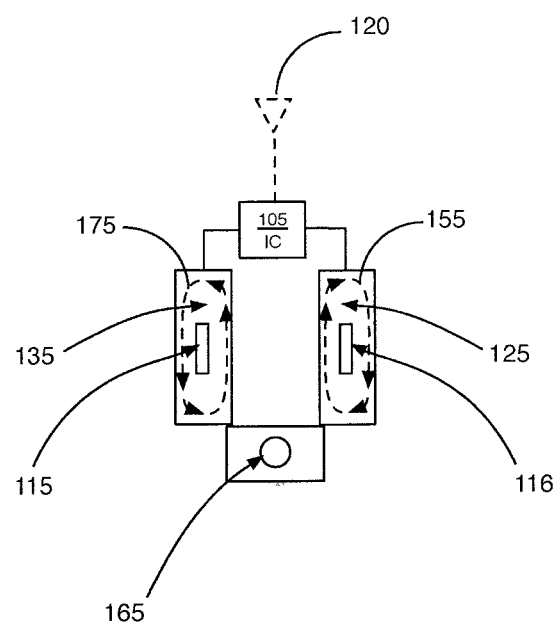
FIG. 1D is a schematic view of an embodiment of the power measurement device of FIG. 1A.

Herein are described one or more example embodiments in accordance with aspects of the present invention. In one embodiment, a power measurement device 100 can take the form of a small attachment useful with a standard plug 110, as shown in FIGS. 1A through 1D. The power measurement device 100 can include an integrated circuit 105, an antenna 120, and a power harvesting unit that includes transformers 125, 135—all arranged within a housing 140, as shown in FIGS. 1A and 1D. The power harvesting unit extracts a fraction of current flowing through an electric power cord (or plug or socket) to an electronic appliance. FIGS. 1B and 1C show different views of the power measurement device 100 of FIG. 1A, apart from plug 110. Housing 140 is preferably made from at least one material that is not electrically conductive, such as plastic, resin, ceramic, or similar materials. Housing 140 is preferably also heat resistant and non-flammable.

The power measurement device 100 can be configured to slide over the exposed contacts 115-116 of an electrical connector 110 (e.g., standard plug), as in FIG. 1A. In this example embodiment, the electrical connector 110 is useful with a Nema 1-15 type electrical outlet, or North American outlet, but in another embodiment the electrical outlet could include a 3 conductor outlet that includes a ground 165 (a Nema 5-15 North American outlet). Yet in other embodiments, the power measurement device 100 could be formed for use with any of the worldwide plug formats that now exist, or that may be developed in the future.

Regardless of the plug type, the power measurement device 100 preferably provides a non-contact means of providing power to an internally located integrated circuit 105 by collecting magnetic energy produced by the conductors 115-116, and converting this magnetic energy into electrical power. In this embodiment, housing 140 includes two openings 142 to accommodate pass through of conductors 115, 116, as shown in FIGS. 1A-1C.

By "non-contact" in this instance it is meant that a physical electrical path between the electrical connector 110 and the power measurement device 100 is not provided, even though the power measurement device 100 and electrical connector 110 (including conductors 115, 116) may be in contact, e.g., in an abutting manner. Note that a physical electrical path may still be utilized to measure parameters of the electrical signal, such as the AC voltage directly, but not for providing power to the power measurement device.

The power measurement device 100 in this embodiment can determine the power consumed by the electrical appliance to which the electrical connector 110 belongs based on the magnetic behavior of the current carrying conductors 115, 116. Conductors 115, 116 have a magnetic field given by Maxwell's equations:

$$\int_{\partial S} H \cdot dl = I_{in}(t) + \varepsilon_0 \frac{\partial \iint_{S(t)} E(t) \cdot dS}{\partial t}$$

$$HL_m \approx I_{in}(t)$$

$$\Rightarrow H \approx \frac{I_{in}(t)}{L_m}$$

Note that the $2^{nd}$ term on the right side of the first equation is ignored due to the fact that, in this embodiment, the power measurement device 100 does not include any electrically polarizing material, or bound currents; if it did, the full equation would be incorporated, but would further complicate the equations that follow. The magnetic field path length $L_m$ is the average path length of the magnetic field within a magnetic material (or air). The final aim is to calculate an induced voltage from a time-varying flux density, $\Phi$, as follows:

$$\int_{\partial S} E \cdot dl = -\frac{\partial \Phi_S(B)}{\partial t}$$

$$V = -\frac{\partial \Phi}{\partial t}$$

$$V = N 2\pi f B(I_{in})(t) \int_{\partial A} f(A) dA$$

If the material is operating in the linear regime, the voltage induced will be:

$$V \approx N 2\pi f \mu_r \mu_0 I_{in}/L_m A$$

And when saturated, the voltage will be:

$$V \approx N 2\pi f B_{ac,max} A$$

If transformers 125, 135 comprise a toroidal magnetic material, magnetic fields 155, 175 (see FIG. 1D) will be generated within the magnetic material when current flows through the conductors 115, 116, rather than in the surrounding air, i.e. the full flux density should be contained within the magnetic material (i.e. power transfer can be close to 100% efficient if the material is not saturated). Therefore, the following transformer equations can be used to calculate the current:

$$P_{in} = P_{out}$$

$$V_{in} I_{in} = V_{out} I_{out}$$

$$\frac{V_{in}}{V_{out}} = \frac{I_{out}}{I_{in}}$$

$$\frac{1}{N} I_{in} = I_{out}$$

Note, across the transformer will be a voltage drop $1/N V_{out}$. In the present embodiment, this cannot be too high compared to the incoming AC voltage or the appliance to which the electrical connector 110 belongs will not be able to properly operate. Given that the additional power draw from the load will be $1/N\ I_{in} V_{out}$, this voltage drop should be a maximum of a few Volts. Note also that the equation above can only be satisfied if there is a finite load connected to the transformer, otherwise, the step increase in current from the input will produce an infinite voltage on the output of the transformer ($L \partial I_{in}(t)/\partial t = L \delta(t)$).

The practical equation for estimation of the magnetic material area requirements (in $m^2$) is:

$$A_c = \frac{V_s}{K_f B_{ac} f N}$$

where $K_f$ is a factor depending on the waveform, which is equal to approximately 4.4 ($2\pi/\sqrt{(2)}$) for sinusoidal modulation.

The power measurement device 100 in this embodiment has a thickness 130 that is not more than about 4 mm thick, and preferably between about 2-4 mm thick in this embodiment—although lesser thicknesses may also be possible. This allows the appliance being plugged in to operate normally within a plug socket, without compromising the mechanical or electrical stability of the plug-socket interface. Therefore, the electrical connector (plug) should be securely and safely maintained in the outlet using such thicknesses.

As is shown in FIG. 1D, the power measurement device 100, as an electrical connector 110 attachment, could also include additional components. Such components could include an integrated circuit (IC 105). IC 105 can include a microprocessor and memory, where the memory stores instructions for measuring, calculating, or otherwise determining power based on magnetic flux and the microprocessor executes the instructions to carry out the steps and functions necessary to measure, calculate, or otherwise determine power based on magnetic flux. The memory can also store relevant values, voltages, currents and conversion factors to calculate power, energy, cost and $CO_2$ consumption. The memory can be, for example, a small scale semiconductor memory, or any other non-transitory storage media.

Power measurement device 100 also includes, in this embodiment, single turn to many turn transformers 125, 135 and can include other passive components to support IC 105, such as passive components for rectification and energy storage, a radio interface to communicate information bi-directionally with IC 105; user interface elements, if required, such as buttons and displays (e.g., E-Ink or other electrophoretic ink, OLED or efficient LCD, which are known in the art) as a mechanism for local input/reporting of information from or to the user, an antenna 120 to radiate radio waves for external communication. Antenna 120 may not be required if the wires attached to the outlet can act as a means to transport information around the facility (e.g., a house), such as is done for Powerline Ethernet communications systems. The frequency range for wireless communications without using the antenna 120 can vary depending on the type of information required, but for relatively low bandwidth, low data rate data such as periodic power measurements, bands of operation may be 20-200 kHz, 24-500 kHz or 2-28 MHz, or any subset thereof are sufficient. Using the antenna 120, the bands of operation could include 13.56 MHz, 30-300 MHz, 430-450 MHz, 860-960 MHz, 2.4-2.4835 GHz, 5.47-5.725 GHz and 60 GHz.

In other embodiments of the invention, power measurement device 100 could be embedded into a power cord electrical connector (or plug) itself, such as electrical connector 110. As the circuitry would be powered by the incoming AC signal, no batteries or other finite lifetime components would be needed, resulting in no decrease of the lifetime of the power cord. If the radio communication system uses backscatter to communicate within a powerline communications system, as an example, then no addition regulatory certification in many regions of the world would be required.

Figure 1E:
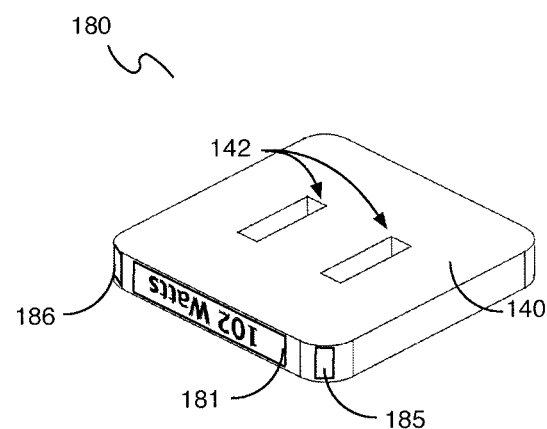
FIG. 1E is a perspective view of a power measurement device with an integral display and input devices, in accordance with aspects of the present invention.

FIG. 1E is a perspective view of the power measurement device 180 with an integral display and input devices, in accordance with aspects of the present invention. In this embodiment, the power measurement devices includes display 181 for presenting power management data, such as power consumed by an appliance with which the power measurement device 180 is being used. Power measurement device 180 also includes buttons 185, 186 for selecting and inputting data, e.g., for mode selection. For example, different modes can display different types of power management data, e.g., power consumption, cost of power consumed. And so on.

Figure 2:
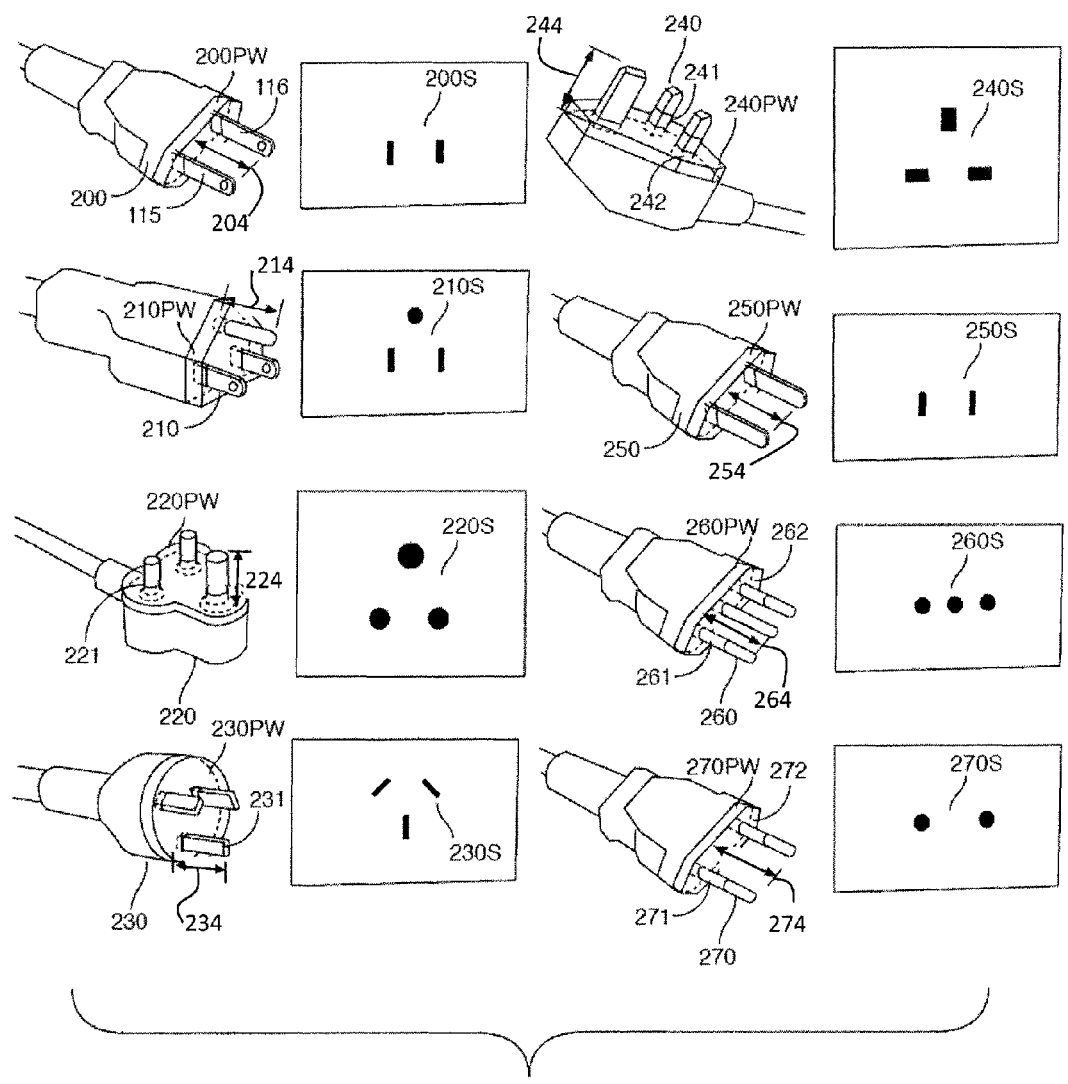
FIG. 2 is a collection of other standard plugs and sockets for which various embodiments of the power measurement device can be configured, in accordance with aspects of the present invention.

FIG. 2 shows a variety of embodiments of plugs that exist around the world, and different embodiments of power measurement device 100 could be adapted for all regions with relatively small mechanical differences. Plug 200 is as also shown in FIG. 1, and includes conductors 115 and 116, in the Nema 1-15 format. The corresponding socket is 200S and the corresponding embodiment of a power measurement device is 200PW. Plug 210 and the corresponding socket 210S corresponds to a grounded version of 200 and the corresponding embodiment of a power measurement device is 210PW, found in the United States, Canada, Mexico parts of Central and South America, Japan, Taiwan and Saudi Arabia, named Nema 5-15. Plug 220 and corresponding socket 220S are used in India, Sri Lanka, Nepal and Pakistan, and represent the former British standard BS546. And the corresponding embodiment of a power measurement device is 220PW. Plug 230 and corresponding socket 230S are used in Australia, and the corresponding embodiment of a power measurement device is 230PW. Plug 240 and the corresponding socket 240S represent the current British standard. And the corresponding embodiment of a power measurement device is 240PW. Plug 250 and the corresponding socket 250S represent the current China standard, and the corresponding embodiment of a power measurement device is 250PW. Plug 260 and corresponding socket 260S are used in Italy, named CEI 23-16/VII, and the corresponding embodiment of a power measurement device is 260PW. Plug 270 and corresponding socket 270S are used in many parts of continental Europe, the Middle East, South America, most African nations and is named CEE 7/16. A small variant of this is used in Korea. And the corresponding embodiment of a power measurement device is 270PW Note for plug 240, as well as for plugs 260 and 270, the two live contacts provide a plastic sheath around the conductors 241 and 242, 261 and 262, and, 271 and 272, respectively. This is to prevent a conductor from falling into the space between the end of the plug connector and the plug and shorting the conductors together. Note that in these cases a contact-based solution, as described in U.S. Pat. No. 7,930, 118, would be infeasible, while a non-contact magnetic transformer solution, as proposed here, would work in all cases. The eight different plugs and socket types shown in FIG. 2 represent a subset of the 13 different worldwide types, but demonstrate similar features (e.g., 2 live conductors; similar diameter, width and length pins) and dissimilar features (e.g., optional ground conductor pin, use of plastic insulation, rectangular or circular pin shape, spacing and placement of pins, voltage range from 100-250V) that would allow a non-contact design power measurement device attachment or embedded solution that could be homologously adapted to the 13 different plug types. That is, in any of these embodiments, the power measurement device could be integral with the plug or removably attachable to the plug by sliding over the protruding conductors.

Figure 3A:
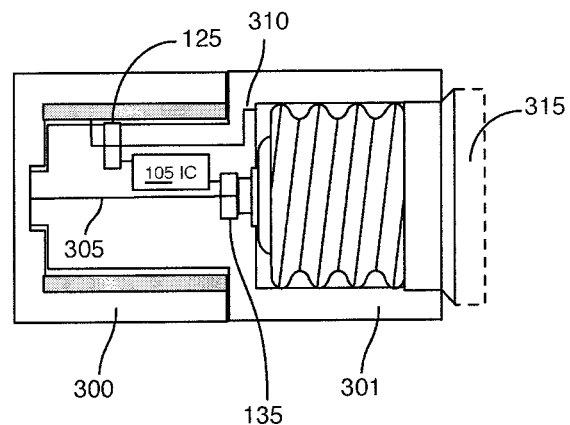
FIG. 3A is a cross-sectional view of a light bulb in a light socket comprising a power measurement device, in accordance with aspects of the present invention.
Figure 3B:
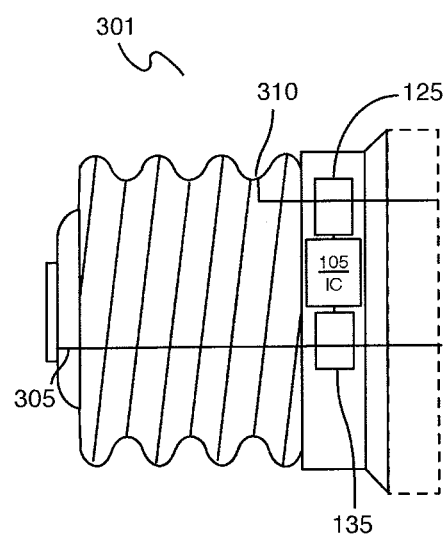
FIG. 3B is a schematic view of an embodiment of a light bulb having an embedded power measurement device, in accordance with aspects of the present invention.

There are some types of electrical sockets that do not fit the model discussed here of a slide-on-connector, such as the standard light socket or specialized connectors for fluorescent tubes or compact fluorescent bulbs. FIGS. 3A and 3B show other embodiments of a power measurement device in accordance with the present invention. The embodiments of FIGS. 3A and 3B could be used for Edison-type light bulb sockets.

In FIG. 3A, a conventional light bulb 315 is attached (e.g., screwed into) to a socket insert 301 containing the magnetics and associated electronics described of the power measurement device 100 above, and measures the power drawn from the bulb 315. The socket insert 301 can be screwed into the light bulb socket 300, and the light bulb 315 can be screwed into the power measurement device 301. In this embodiment, transformers 125, 135 form part of the power measurement device 301, and a magnetic field is formed therein when power is applied to the metal light bulb base. Item 305 represents a neutral wire of the power measurement device and item 310 represents a live wire of the power measurement device. These wires are disposed in a housing of the socket insert to enables the electrical connections that would be present between if the bulb 315 were directly screwed into light socket 300. The housing is comprising of a material that is not electrically conductive, such as ceramic, plastic, resin, and the like.

In FIG. 3B, the power measurement device is integral with the bulb 315. Therefore, the bulb 315 can be directly screwed into a socket. More particularly, in this example, the transformers 125, 135 and IC 105 are integrated into a ceramic housing of a bulb. This bulb could be a traditional incandescent light bulb, compact fluorescent (CFL) or Light Emitting Diode (LED). These methods could be adapted to work with other light sockets such as Halogen or fluorescent tube lighting. For example, various forms of the power measurement device could be utilized in fluorescent tubes that are slightly shorter than the standard lengths, accommodating a power measurement device containing the components discussed herein.

Figure 3C:
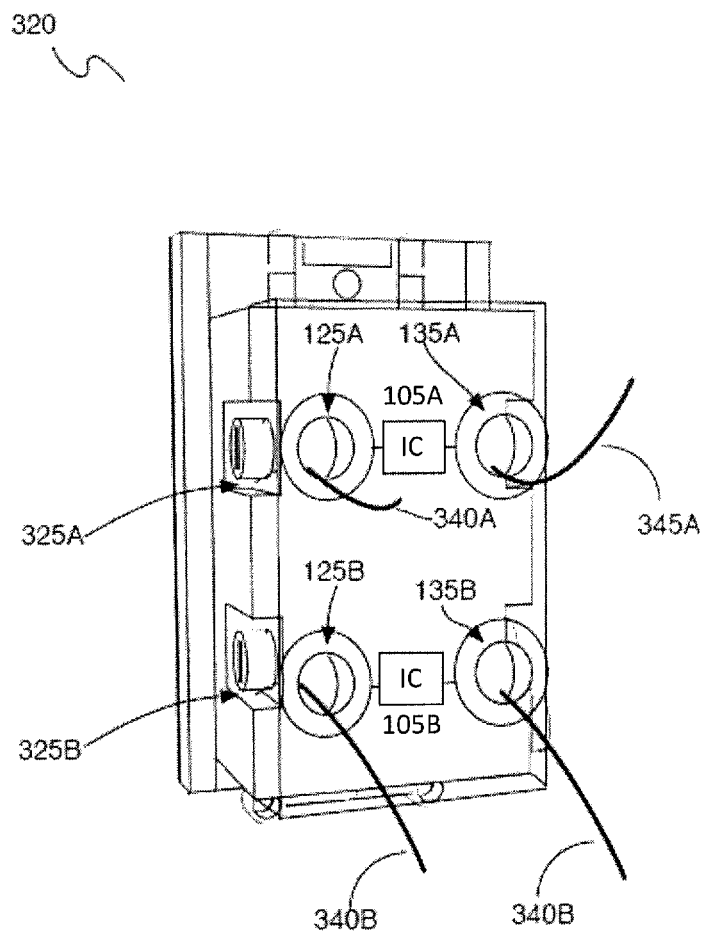
FIG. 3C is a rear view of an embodiment of an electric outlet configured with an embedded power measurement device, in accordance with aspects of the present invention.

FIG. 3C is a rear view of an embodiment of an electric outlet configured with an embedded power measurement device, in accordance with aspects of the present invention. In this embodiment, since the outlet is a two-plug outlet, the power measurement device includes two power measurement devices, one per plug. A first power measurement device includes transformers (comprising magnetic materials) 125A, 135A and IC 105A. Each transformer 125A, 135A is disposed proximate to a different terminal of its corresponding outlet. Wire 340A connects to terminal 325A and includes an exposed portion (as a conductor) next to transformer 125A. Similarly, wire 345A connects to terminal (not shown) and includes an exposed portion (as a conductor) next to transformer 135A. The same arrangement is used for the second power measurement circuit, with similar elements designated with a "B" instead of an "A". Optionally, a display could be included that extends peripherally from the faceplate of the outlet for presenting power measurement data. In other embodiments, the faceplate could be configured with a display. In still other embodiments, the power measurement device could communicate with at least one computer via a wired or wireless network, or some combination thereof.

Such computer could aggregate power measurement data for a plurality of power measurement devices within a facility, e.g., home.

Similarly, a light switch could be configured with a power measurement device.

Figure 4A:
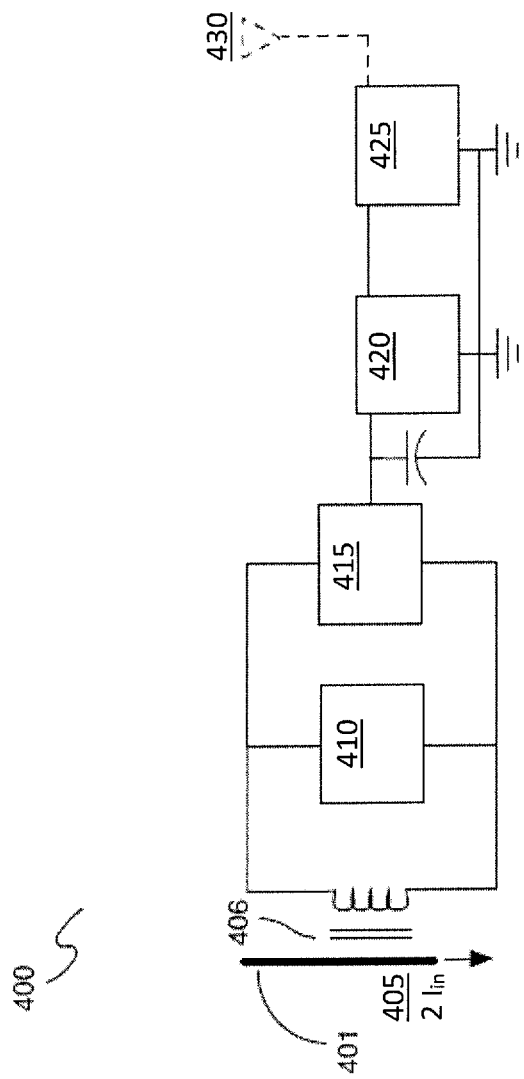
FIG. 4A is a basic block level diagram of an embodiment of a power measurement device, in accordance with aspects of the present invention.
Figure 4B:
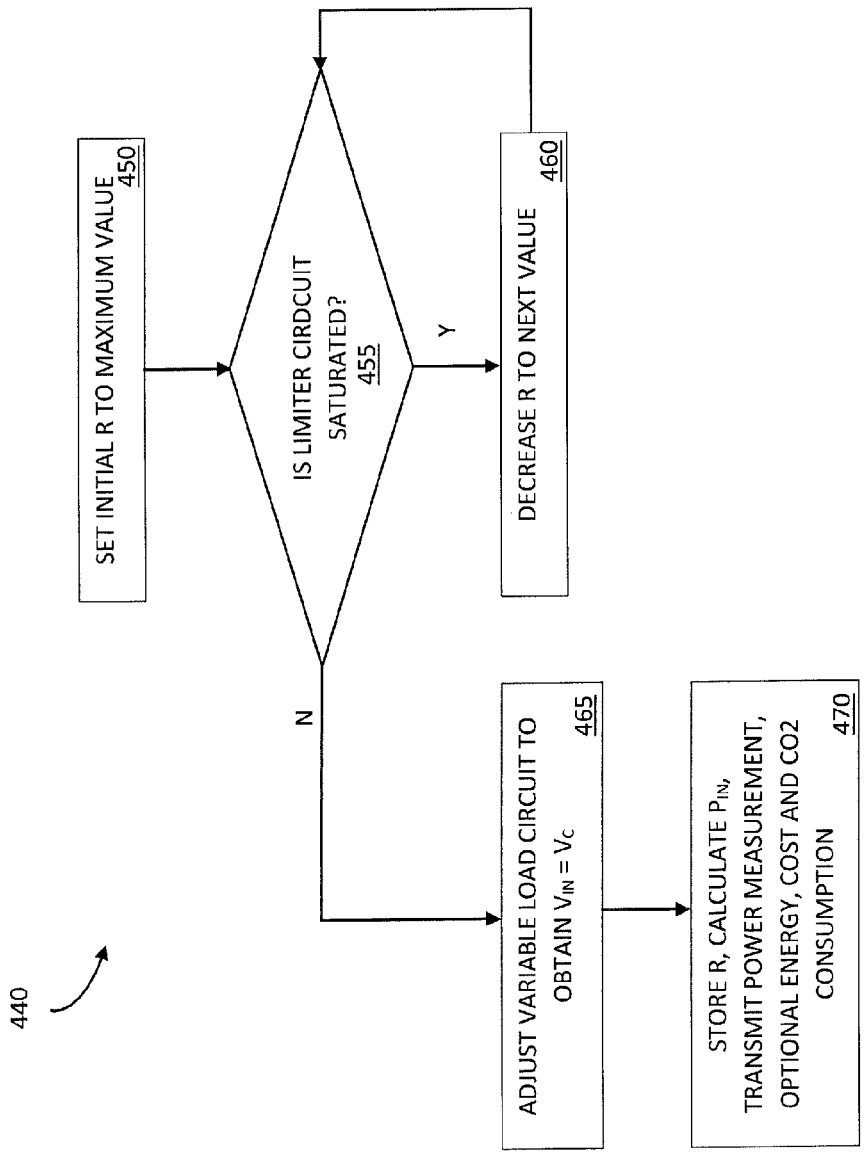
FIG. 4B is a logic diagram of a method to deliver a constant input voltage into the power measurement device.

FIG. 4A shows the basic block level diagram of an embodiment of a power measurement device 400, such as those described herein as 100 and 301. And FIG. 4B is a logic diagram of a method to deliver a constant input voltage into the power measurement device.

Referring to FIG. 4A, for clarity, a single blade of an electrical conductor (e.g., 115, 116) is shown as a conducting wire 401, but the current is represented as 2 $I_{in}$ 405. A magnetic core and N turn secondary part of the transformers 406 form an inductive reactive input impedance into the circuit. The first circuit subcomponent is a limiter circuit 410. Given that the power flowing through the wires can vary by 4-6 orders of magnitude (e.g., 0.1 W to 10000 W), from the equations above, if the magnetic material operates in the linear regime, the voltage for a constant load will vary linearly with the input power.

In one embodiment, with standard magnetic materials, 4000 turns on the secondary transformer, and a load resistance of 13.4 kOhms, the voltage into the circuit for a 1000 W input would 28V. This voltage is too high for standard CMOS circuitry and would need to be limited with a limiter circuit, to limit the output voltage to the range of approximately 0.3 to 3.3V. Limiter circuits have been standardized in RFID tags that have a wide input dynamic range (−20 to +20 dBm), essentially a Zener diode or cross-pair of diodes equivalent implemented in CMOS. Above 1000 W, the magnetic core would be in saturation, the voltage would not rise significantly above 28V, and one would not be able to utilize the voltage measurement to indirectly measure the power through the pins 401.

For the same embodiment at 13.1 W input power on the conductors 401, the voltage would be 0.37 V. To properly operate CMOS transistors in a floating or non-floating gate regime requires the transistors be biased with a minimum voltage at a minimum power for the system. As is done in RFID transponder tags, a minimum voltage of about 0.25-0.4 V is cascaded through a CMOS-based version of a Dickinson stage that allows a DC supply voltage of 0.8-1.2V to be generated from a lower AC supply voltage.

Figure 6:
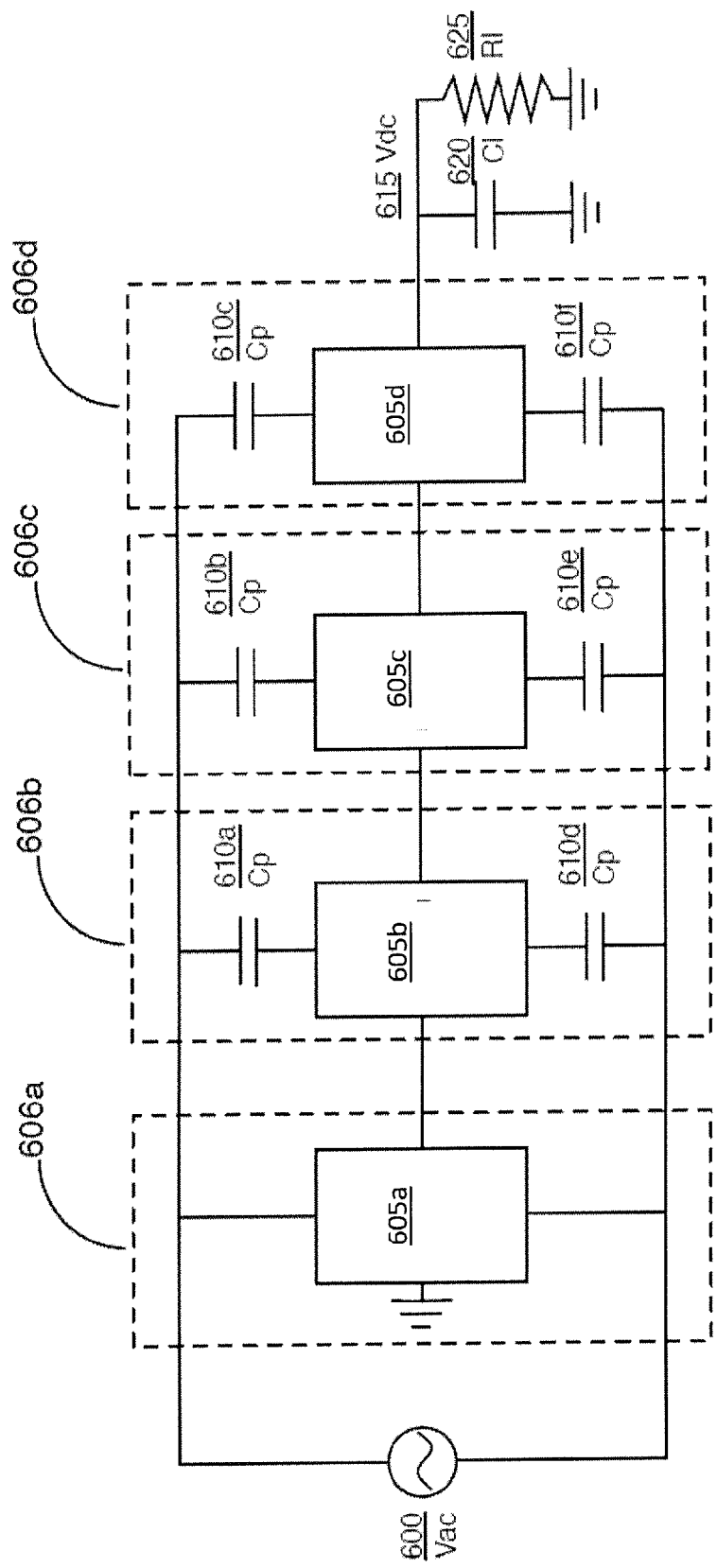
FIG. 6 shows an embodiment of a Dickinson stage cascade circuit with 4-stages of rectifiers, that can form part of the power measurement device, in accordance with aspects of the present invention.

A high level diagram of the contents of the Cascade circuit 415 is shown in FIG. 6 as a four-stage circuit. Rather than maintain a constant load impedance to the transformer, that would saturate the limiter circuit 410 over much of the input range, a variable load impedance 420 can be utilized to maintain a fixed voltage and keep the limiter circuit 410 out of compression. When the device 400 is off and an electronic appliance is plugged into a socket, the default resistance could be high and designed for a minimum input power. If the limiter circuit 410 is saturated, the control circuitry 425 could lower the load impedance 420 until the limiter was out of saturation and the input voltage was below a threshold. As will be discussed in more detail, if the input voltage can be controlled to an accurate and precise setting, the resistance value in the variable load circuit 420 can be related to the incoming power measurement:

$$P_{device} = N \frac{V_t}{R} V_{AC}$$

Where $V_t$ is the input threshold voltage the controller is attempting to adjust the circuit to, R is the input control resistance from the variable load circuit (together these define the current into the circuit), the number of turns of the transformer and the AC voltage (typically 100-240V AC RMS). The control circuitry 425 would control the load circuit, but also be responsible for resetting the device upon power up, maintaining storage of measured power, and potentially including an active or backscatter radio for bidirectional communication in the far-field or in the near-field over the AC lines (electrical conductors 401).

Figure 5:
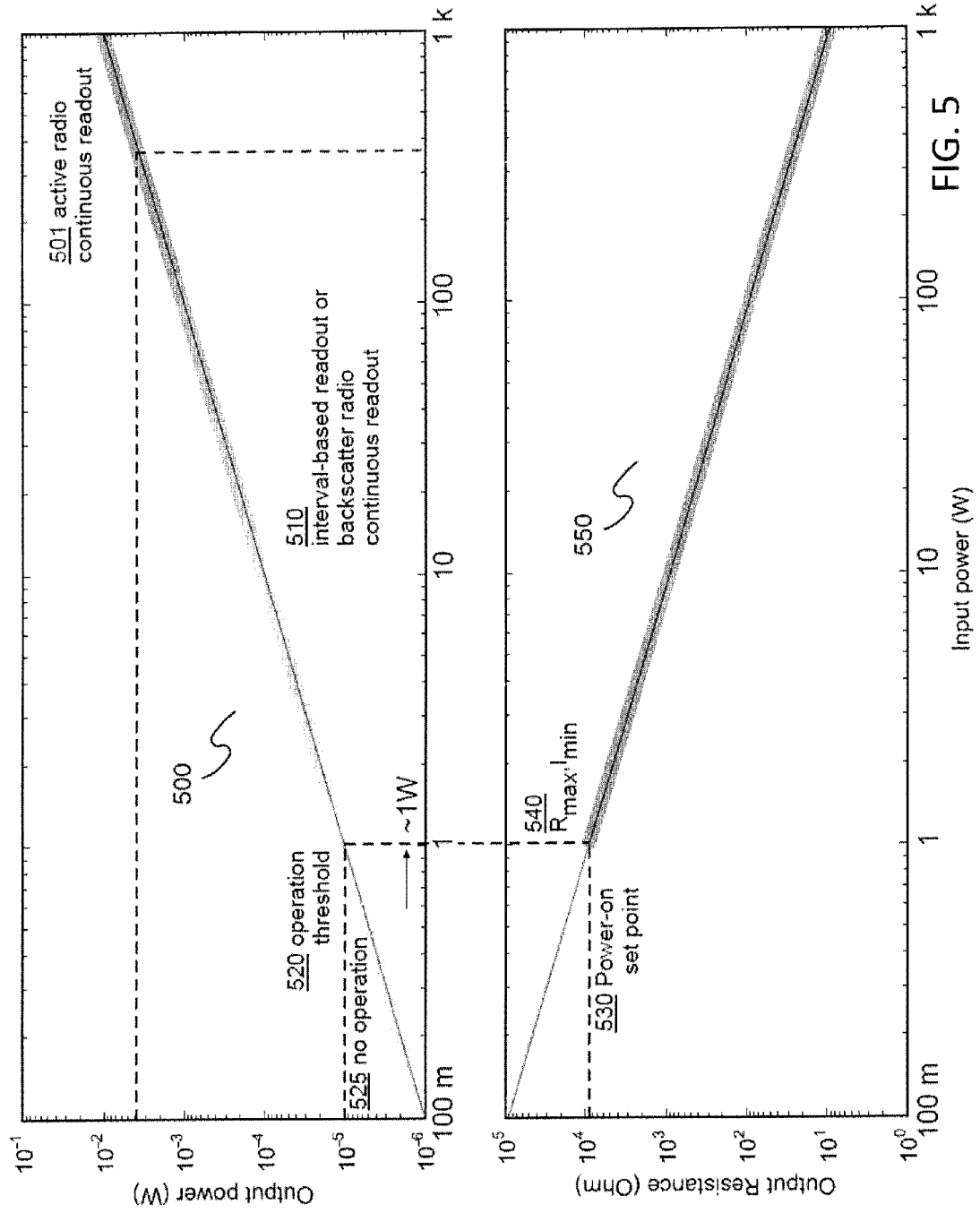
FIG. 5 shows one embodiment of a relationship between the input power and power available to the power measurement device circuit over 5 orders of magnitude of input power, in accordance with aspects of the present invention.

FIG. 5 shows one embodiment of the relationship between the input power and power available to the circuit over 5 orders of magnitude of input power (100 mW to 1000 W) 500. For this embodiment, if the input power is below 1 W, the output power would drop below 10 µW 525, which is lower than the lowest known power for a complete circuit and the typical threshold found in state-of-the-art RFID circuits. It is anticipated that a system design point of 1 W input power (at 520) is sufficient for most commercial and consumer applications of power monitoring.

It should also be noted the ratio of input to output power is more feasible than outlined in U.S. Pat. No. 7,930,118. In this reference, measurement of the power used at 10 amperes through blade yields 18 µA at 5 volts which equals 90 µW. Translating these values into input and output power indicates that 1200 W is required to supply 90 µW to their device. This ratio of 13.3 million:1 would make this system infeasible for common use, unlike the 100000:1 utilized here. The power measurement device in accordance with aspects of the present invention includes at least three innovations above the state of the art: (1) the design of the magnetic circuit to maximize the originating voltage into the circuit; (2) the Cascade circuit 415, to reduce the requirements on the number of turns required in the secondary transformer; and (3) a variable load impedance circuit 420 to measure the power consumption of the device while maintaining a constant input voltage to the power measurement control and radio circuit 425.

Beyond the operational threshold 520, in this embodiment, the amount of power supplied from 1 W up to approximately 350 W is insufficient to power an active radio continuously, although an energy storage device such as a capacitor could be used to provide intermittent power to an active radio. For known commercial powered active radios, such as 802.15.4, Zigbee, Bluetooth/Bluetooth Low Energy, 802.11a/b/g/n/ac Wifi, these radios would need to be intermittently powered such that the average power draw equals the circuit power threshold. Above the operation threshold 520 a backscatter device could operate continuously. A powered backscatter device presently has a maximum sensitivity of about −30 to −36 dBm (50 to 56 dB of total dynamic range) and requires about 10 µW to operate. Above the active radio continuous readout threshold (at 501), an active radio could operate continuously. For an active radio design, the amount of time a radio would be powered would be proportional to the input power draw from the electronic appliance; this is commensurate with ensuring the highest power devices have the most access to a shared channel. The lower plot 550 shows the load resistance required to maintain a constant voltage of 0.3V into the Cascade circuit 415. The resistance at the operation threshold $R_{max}$, $I_{min}$ indicates a system design point, a point that can be changed for different system design considerations. The variable resistance is shown as a continuous parameter over the input power range, but for practical circuits, this parameter will require finite control and be low-power, as will be discussed in more detail.

FIG. 6 shows a Dickinson stage cascade circuit with 4-stages of rectifiers (600a-d), producing a voltage 615 at the output with a final smoothing capacitor 620. The input voltage 600 is the voltage produced at the output of the magnetic circuit. The load resistance 625 could be variable as is represented in 420 (FIG. 4A) and graphically in 550 (FIG. 5). This circuit is typical of the state of the art as utilized in passive RFID systems.

Rather than utilize a traditional ADC (Sigma-delta or other time-domain architecture) to measure the voltage and hence power input for this system, it is important to recognize that at high input currents, the magnetic circuit will be pushed into saturation (peak flux density for most magnetic materials is about 0.5-2.2 T, and with the example given above, the maximum voltage would be approximately 1.6V). It is desired to have a variable load presented to the magnetic circuit/inductance, in which the maximum load $R_{max}$ (see FIG. 5) is set based on achieving a minimum circuit power at a minimum input current $I_{min}$ (see FIG. 5 550), keeping the limiter circuit 410 out of saturation.

Figure 7A:
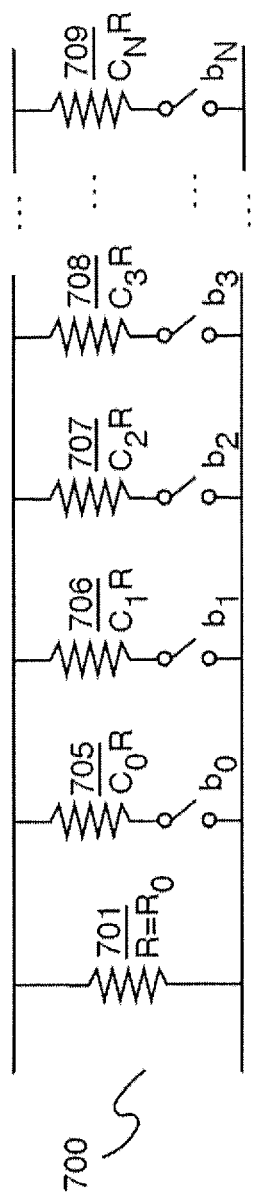
FIG. 7A is a circuit diagram of a parallel resistor bank, that could form part of a power measurement device, in accordance with aspects of the present invention.

One embodiment for a variable load circuit that is low power and would create a digital output, hence removing the need for an ADC (analog to digital converter), is a parallel resistor bank, as shown in FIG. 7A. The input resistance 700 of this circuit is:

$$\frac{1}{R} = \frac{1}{R_0} + \frac{b_0}{C_0 R} + \frac{b_1}{C_1 R} + \dots$$

Where $R_0$ 701 is a fixed resistance in the circuit. The remaining resistances 705 to 709 define an N-bit resistor register, where each resistor in the parallel bank has a corresponding CMOS switch 705-709 to enable or disable a particular register. An implementation will be required to factor in the on and off resistance of the CMOS switches. In some embodiments, the number of independent resistors is 8, 10, 11, 12, 14, 16, 22, or 24. The value of R that is needed over the input power range is to keep the input voltage constant:

$$R = V_t/I_s \Rightarrow 1/R = I_s/V_t = P_{in}/V_{in}/V_t/N$$

$$1/R_{min} = P_{in,min}/V_{in}/V_t/N$$

$$1/R_{max} = P_{in,max}/V_{in}/V_t/N$$

If all $b_0$ are set to 1, and the $C_i$ are inverse powers of 2:

$$\frac{1}{R_{max}} = \frac{1}{R_0} + \frac{2^M - 1}{R}$$

$$\Rightarrow (P_{in,max} - P_{in,min})/V_{in}/V_t/N = \frac{2^M - 1}{R}$$

$$R = \frac{(2^M - 1)V_{in}V_t N}{P_{in,max} - P_{in,min}}.$$

This can also be split into two separate banks of resistors to minimize the number of bits required. For example, the 22 total bits are used for FIG. 7B with two 11-bit banks. The first bank is designed to operate in the digital range of 0-2047, while the second bank is designed to operate in the digital range of 2048-4095 720.

Figure 7B:
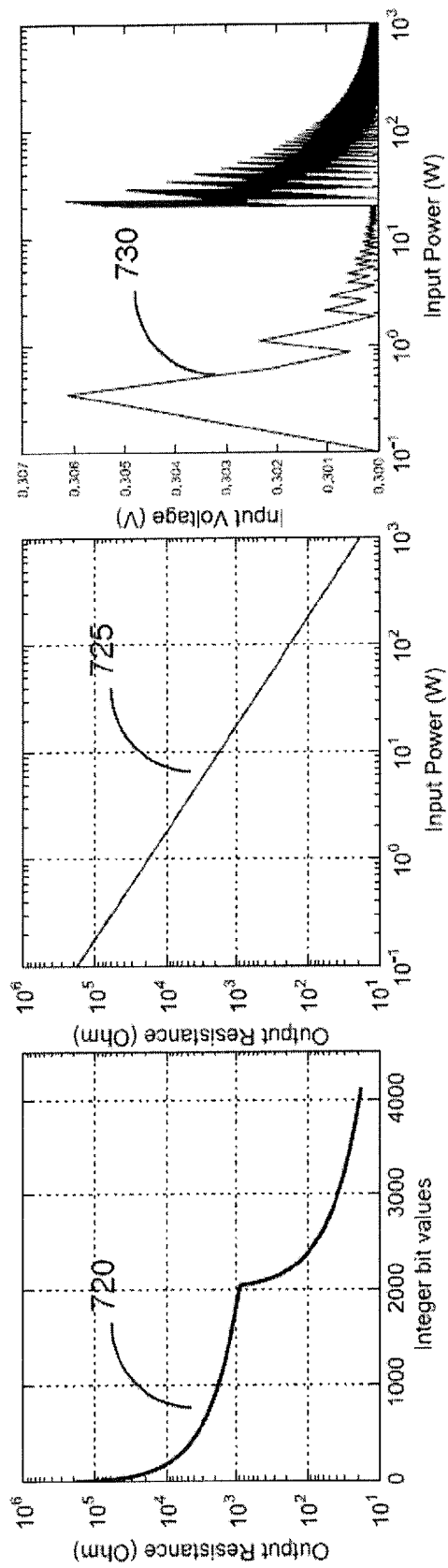
FIG. 7B is a set of output plots generated from the circuit of FIG. 7A.

In FIG. 7B, plot 725, this is a plot of the ideal resistance required (line), similar to that from 550, with a corresponding plot of the overall resistance R obtained from a 22-bit resistor bank (dashed). At this scale, the differences in the ideal and quantized resistance curve are negligible. In FIG. 7C, plot 730 shows the resulting voltage for the 22 resistor bank over a 5 order of magnitude input power range; the maximum excursion is 2%. This excursion would establish a lower bound on the power accuracy obtainable with this system. Note this plot is the final solution of resistor values; the initial value chosen could be substantially higher and due to other errors in the system, may not settle on the ideal final value.

Referring again to FIG. 4B, the control algorithm 440 for adjusting the bit values will start with the highest resistance or a cached resistor value 450. The control circuitry will detect if the limiter circuit 410 is in saturation 455; if it is, the variable load circuit 420 will be decreased in resistance to the next value 460 and this process repeated. If the limiter circuit is not in saturation, the variable load circuit will have the resistance altered 465 to choose the resistance which places the input voltage into the overall circuit as close a value as possible to the threshold voltage, in the case of FIG. 7B, 0.3 V. After the optimal load resistance is chosen, this value may be stored, processed into power, energy, cost or CO2 consumption and be transmitted through the building wiring system or wirelessly 470.

Considerations of the time to settle upon a solution are necessary, but the convergence of the algorithm must undergo no oscillations that have voltage operation below the threshold for the cascade circuit, Vt. That is the control algorithm must be over damped or critically damped. The control algorithm would observe the generated voltage into a comparator and would lower the resistance until the voltage started to change (limiter circuit out of saturation) and then would try to move the operation point of the voltage generated to be as close to the threshold voltage $V_t$ (the minimum value of $V_{ac}$) as shown in 730 from FIG. 7B) as possible, but not lower. As a further extension of the control algorithm, it is anticipated that one may also be able to use the voltage slew rate to better select the resistors to switch in and out of the circuit).

The following are design considerations related to embodiments discussed herein, or related to other embodiments that are also considered to be within the scope of the present invention.

Measurements of functional air gap between the flat surface of the electrical plug connector to the flat surface of the outlet or extension cord receptacle to maintain operation is up to about 1 cm in the present embodiment for the North American 2 and 3-pin plugs (Nema 1-15 and 5-15). Experimental testing of a number of plugs and receptacles (in extension cables) has led to this determination. This margin is substantially higher than the 2-4 mm preferred for the presently envisioned applications, and provided the device is not too heavy relative to the reduced friction load of the leads within the socket (AC to DC adaptors generally provide the largest gravitational load on a connector/socket connection), should provide necessary gravitational support.

In some parts of the world, including the US, one can obtain voltage directly, as the metal conductors are exposed to the face of the power connector. One can therefore separate the use of magnetics to measure power consumption. The voltage difference before and after the transformer could be used to directly measure the voltage in the secondary circuit. The magnetic components will need to be placed after the point of contact for maximum accuracy. Although a contact arrangement is feasible, as outlined in U.S. Pat. No. 7,930,118, the use of a non-contact arrangement is thus preferred for worldwide operation.

In some instances, the cascade circuit 415 will convert the AC signal of frequency 50-60 Hz into a DC signal to power the remaining parts of the circuitry. In other embodiments, the time of the positive and negative peaks of the AC cycle may be long enough to only power the circuit during a small window of the AC cycle; this may reduce cost by allowing smaller capacitors to be used in a rectification circuit.

One concern may be the measurement accuracy of the current being measured. The secondary system will draw roughly 1 part in 100,000 of the power through the input, therefore a phase or voltage error will be very small. Note also the voltage drop across the magnetic interface of this connector will be 1/N of the voltage generated on the secondary side. If the voltage to be matched is to be kept close to $V_t$=0.3V, then the voltage change from the line voltage of 120/220 V will be on the order of 150 µV to 3 mV.

Figure 8:
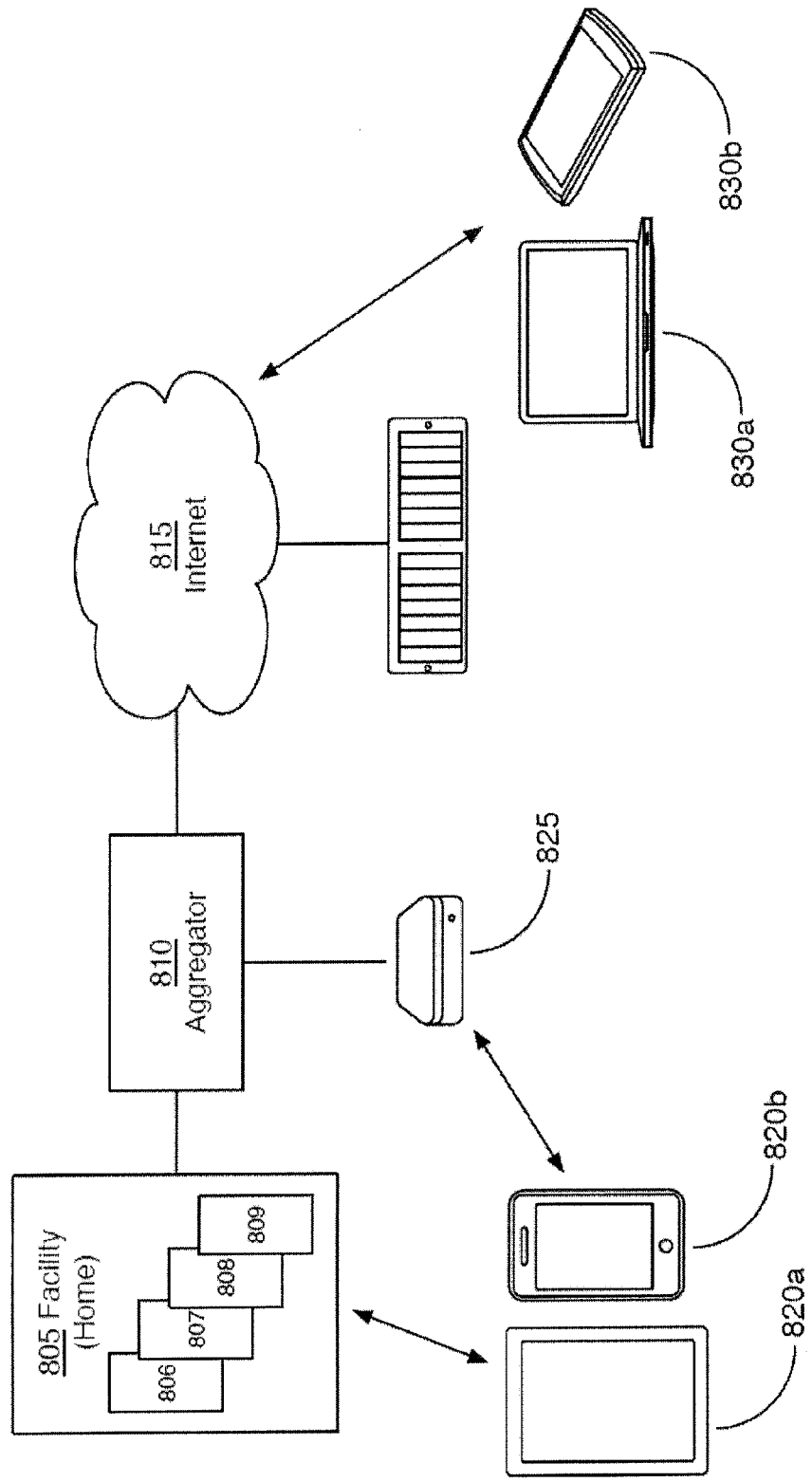
FIG. 8 is an example embodiment of an application the power measurement device, in accordance with aspects of the present invention.
Figure 9:
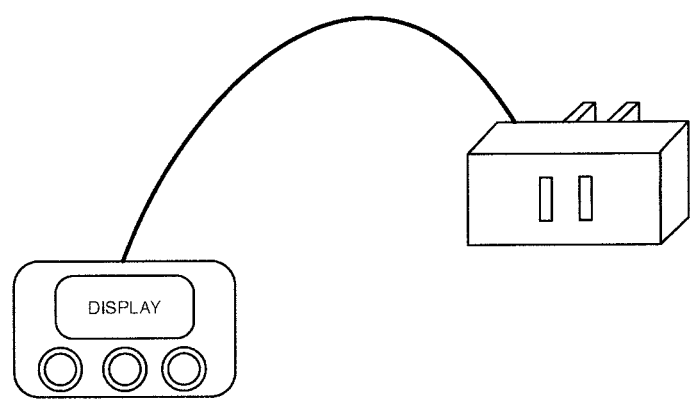
FIG. 9 is a perspective view of a prior art power monitor.

One potential application embodiment of this technology is shown in FIG. 8, as a power measurement system that includes one or more power measurement devices monitoring power consumption within a facility, e.g., a home. A user in a Facility 805 (e.g., home, office or other indoor environment) is able to utilize a mobile device (e.g., laptop, desktop, tablet 820a, smartphone 820b, etc.) to obtain a real-time view of where power is being drawn in the Facility 805 via the various electronic appliances 806-809 that each use an embodiment of a power measurement device, either through an attachment or embedded into the power cord or outlet, as examples. A computer application could be downloaded onto one or more of these mobile devices to provide varying degrees of information to the user. The information could be communicated over a wired or wireless network within the facility.

As an example, if a far-field backscatter system was utilized as the radio communication technology, the user would be required to walk to within proximity (1 cm-10 m) of each electronic appliance. Otherwise, using a backscatter or active HF radio coupled to the power lines, or an active far-field radio technology such as Bluetooth Low Energy or Wifi, an aggregator device 810 could assemble all the power information for all electronic appliances in the facility for the user to review. The communication range from a single device to a user could be 1 cm to 100 m, based on design/ability to locate where devices are.

The entire system could exist within the home, or this information or a subset of this information could be sent to the Internet to a cloud system 815. From the cloud system 815, other devices and users 830a and 830b could monitor this information. It is also anticipated that the radio communications system as part of this invention could be bidirectional; thus from any of the control devices 820a, 820b, 830a, 830b, data could be sent to the appliances. In other embodiments of this invention, the non-contact power measurement would not be utilized, but the near-field HF radios could be incorporated directly into the regulator chips of the electronics; signals received from these control devices could be used to shut off power to the devices for a complete Facility control system.

Preferably, the magnetic material is put on at least the other current carrying conductor to avoid magnetic coupling issues. A GND connection point may also be needed if significant current flows to ground (see FIG. 1D). A very high permeability material may be required to act as a shield between transformers.

It is anticipated this technology could become a worldwide standard where this device is integrated directly into the cords of consumer electronic devices. For companies using electrical motors and cables or simple electronic devices, but do not have software, magnetics and silicon design expertise to design a component of this complexity, a company could exist to provide an OEM version of this system which could be integrated directly into the plastics/rubber of the AC cord.

While the foregoing has described what are considered to be the best mode and/or other preferred embodiments, it is understood that various modifications can be made therein and that the invention or inventions may be implemented in various forms and embodiments, and that they may be applied in numerous applications, only some of which have been described herein. It is intended by the following claims to claim that which is literally described and all equivalents thereto, including all modifications and variations that fall within the scope of each claim.

What is claimed is:

1. A power measurement device, comprising:
   a power harvesting unit configured to extract a fraction of power from an electric power supply unit of an electronic appliance,
      the power harvesting unit comprising one or more transformers disposed within a housing formed of an electrically non-conductive material, the one or more transformers configured to collect magnetic energy from an electrical connector of the electronic appliance without a physical electrical path;
   a power determination circuit electrically coupled to the one or more transformers, the power determination circuit powered by the extracted power and configured to generate power measurement data indicative of at least one of the extracted current or a power consumed by the electronic appliance determined based on the extracted power; and
   an output device that outputs the power measurement data.

2. The power measurement device of claim 1, wherein the power harvesting unit is configured to extract an amount of the current flowing through the electric power supply unit that is proportional to the number of wire turns around at least one of the wires of the power supply unit.

3. The power measurement device of claim 1, wherein the power harvesting unit is configured to extract at least a minimum threshold voltage from the current through the electric power supply.

4. The power measurement device of claim 1, wherein the power harvesting unit is a non-contact unit.

5. The power measurement device of claim 1, wherein the power harvesting unit includes a contact unit configured to extract the voltage through an ohmic contact to the electrical power supply unit.

6. The power measurement device of claim 1, wherein the electric power supply unit is one of an electrical plug, an outlet, or a switch.

7. The power measurement device of claim 1, wherein the output device is a local display integral with the housing and configured to locally report power measurement data to a user.

8. The power measurement device of claim 1, wherein the power measurement device is removably attachable to a plug.

9. The power measurement device of claim 8, further comprising:
   a housing having plug conductor openings formed therein and having a thickness of not more than about 4 mm at the plug conductor openings.

10. The power measurement device of claim 1, wherein the power measurement device is removably attachable to an outlet.

11. The power measurement device of claim 1, wherein the power measurement device is removably attachable to a switch.

12. The power measurement device of claim 11, wherein the power measurement device takes the form of a small attachment that fits between the switch and a switch cover plate.

13. The power measurement device of claim 1, wherein the power measurement device is removably attachable to a light socket.

14. The power measurement device of claim 13, further comprising:
a housing configured to couple to a light bulb socket and to receive a light bulb, the housing containing the power harvesting unit and the power determination circuit.

15. The power measurement device of claim 1, wherein the power measurement device is integral with a plug.

16. The power measurement device of claim 1, wherein the power measurement device is integral with an outlet.

17. The power measurement device of claim 1, wherein the power measurement device is integral with a switch.

18. The power measurement device of claim 1, wherein the power measurement device is integral with a light socket.

19. The power measurement device of claim 1, wherein the power measurement device is integral with the electronic appliance.

20. The power measurement device of claim 1, wherein the output device includes a wireless transmission device configured to transmit a signal indicative of the power measurement data.

21. The power measurement device of claim 20, wherein the wireless device is configured to wirelessly couple to the building wiring to transmit the signal indicative of the power measurement data.

22. The power measurement device of claim 1, further comprising:
a voltage cascade circuit configured to output a stable DC voltage from a lower AC voltage resulting from the extracted power and to provide the DC voltage to electronics within the power measurement device.

23. The power measurement device of claim 1, further comprising:
a variable load circuit configured to measure the extracted power and to control an amount of power applied to electronics within the power measurement device.

24. The power measurement device of claim 1, wherein the output device is configured to directly couple to building wiring to transmit a signal indicative of the power measurement data.

25. A power measurement system that monitors power consumption within a facility, the system comprising:
at least one computing device configured to receive power measurement data; and
at least one power measurement device, each power measurement device comprising:
a power harvesting unit configured to extract a fraction of power from an electric power supply unit,
the power harvesting unit comprising one or more transformers disposed within a housing formed of an electrically non-conductive material, the one or more transformers configured to collect magnetic energy from an electrical connector of an electronic appliance without a physical electrical path;
a power determination circuit electrically coupled to the one or more transformers, the power determination circuit powered by the extracted power and configured to generate power measurement data indicative of at least one of the extracted current or a power consumed through the electric power supply unit; and
an output device that outputs the power measurement data.

26. The power measurement system of claim 25, wherein the at least one computing device is configured to aggregate power measurement data from a plurality of power measurement devices received via a network.

27. The power measurement system of claim 25, wherein the at least one computing device includes at least one mobile device configured to receive and output the power measurement data.

28. The power measurement system of claim 25, wherein the at least one computing device is accessible via a network, and enables access to the power measurement data via the network.

29. The power measurement system of claim 28, wherein the output device includes a wireless transmitter configured to communicate with the at least one computing device via a local network within the facility.

30. The power measurement system of claim 29, wherein the wireless transmitter is configured to wirelessly couple to the building wiring to transmit a signal indicative of the power measurement data.

31. The power measurement system of claim 25, wherein the electric power supply unit is one of an electrical plug, an outlet, or a switch.

32. The power measurement system of claim 25, wherein the power measurement device is integral with a plug.

33. The power measurement system of claim 25, wherein the power measurement device is removably attachable to the electronic appliance.

34. The power measurement system of claim 25, wherein the power measurement device is removably attachable to a plug, an outlet, a switch, or a light socket.

35. The power measurement system of claim 25, wherein the power measurement device further comprises:
a voltage cascade circuit configured to output a stable DC voltage from a lower AC voltage resulting from the extracted power and to provide the DC voltage to electronics within the power measurement device.

36. The power measurement system of claim 25, wherein the power measurement device further comprises:
a variable load circuit configured to measure the extracted power and to control an amount of power applied to electronics within the power measurement device.

* * * * *